United States Patent [19]

Walraven

[11] 4,190,871
[45] Feb. 26, 1980

[54] MAGNETIC CONVERTER HAVING A MAGNETORESISTIVE ELEMENT

[75] Inventor: Anthonie Walraven, Eindhoven, Netherlands

[73] Assignee: U.S. Philips Corporation, New York, N.Y.

[21] Appl. No.: 880,443

[22] Filed: Feb. 23, 1978

Related U.S. Application Data

[63] Continuation of Ser. No. 682,643, May 3, 1976, abandoned.

[30] Foreign Application Priority Data

Jun. 13, 1975 [NL] Netherlands ............... 7507049

[51] Int. Cl.$^2$ .................... G11B 5/12; G11B 5/22; G11B 5/30
[52] U.S. Cl. ................................ 360/113; 360/66; 360/123
[58] Field of Search .................... 360/113, 66, 123; 340/174 EB; 324/46; 338/32 R; 331/102 G; 365/158, 8

[56] References Cited

U.S. PATENT DOCUMENTS

| 3,467,789 | 9/1969 | Johnson et al. ............... 360/123 |
| 3,493,694 | 2/1970 | Hunt ............................... 360/113 |
| 3,691,540 | 9/1972 | Almasi et al. ................. 360/113 |
| 3,716,781 | 2/1973 | Almasi et al. ............. 340/174 EB |
| 3,813,660 | 5/1974 | Buherer ..................... 340/174 EB |
| 3,820,092 | 6/1974 | Bobeck et al. ............ 340/174 EB |
| 3,868,954 | 2/1975 | Cornwell et al. ............ 331/107 G |
| 3,881,190 | 4/1975 | Brock et al. ................... 360/113 |
| 3,882,528 | 5/1975 | Boccon-Gibod ............ 331/107 G |
| 3,886,471 | 5/1975 | Massani ....................... 331/107 G |
| 3,887,944 | 6/1975 | Bajorek et al. ................. 360/113 |
| 3,979,775 | 9/1976 | Schwarz ......................... 360/113 |

OTHER PUBLICATIONS

IBM Tech. Disc. Bull., Hagopian, Magnetoresistive Type Hand-Scanning Magnetic Transducer, vol. 14, No. 8, Jan. 1972, pp. 2488-2489.

*Primary Examiner*—Alfred H. Eddleman
*Attorney, Agent, or Firm*—Algy Tamoshunas

[57] ABSTRACT

A magnetic converter having a magnetoresistive element, the resistance of which is measured by means of an alternating current having a frequency which is larger than $8\rho/\mu D$, where $\rho$ is the resistivity, $\mu$ the magnetic permeability and D the cross-section of the element so that the current distribution is concentrated at the edges of the element due to the resultant lateral skin effect.

5 Claims, 2 Drawing Figures

MAGNETIC CONVERTER HAVING A MAGNETORESISTIVE ELEMENT

This is a continuation of application Ser. No. 682,643, filed May 3, 1976, now abandoned.

The invention relates to a magnetic converter for detecting information-representing magnetic fields on a magnetic recording medium which is movable relative to the converter, comprising a substantially rectangular strip of magnetoresistive material having a free edge which is intended to face the recording medium, and two electric connections on opposite ends of the strip for connection to an electrical circuit for detecting resistance variations, said circuit comprising a current source.

Magnetic converters in which a magnetoresistive element is used as a sensing element are known, for example, from U.S. Pat. Nos. 3,493,694 and 3,691,540. The operation of such magnetoresistive heads is based on the use of a strip-shaped element of a ferromagnetic, metallic material, for example Ni-Fe, which is provided on a non-magnetic substrate and which is moved in the immediate proximity of, or in contact with, a magnetic recording medium for reproducing the information contents thereof. The field of the recording medium produces variations in the magnetic condition of the element and modulates the resistance thereof via the so-called magnetoresistance effect. Thus, when the recording medium passes the head, the information-representing magnetic fields present on the medium rotate the spin system of the magnetoresistive element so that its resistance varies. In this manner, the output signal of an external electrical circuit which is connected to the element is in the form of current or voltage fluctuations representing the information stored in the recording medium. For this purpose, the ends of the element are connected to a current source which supplies a measuring current which may be either a direct current or an alternating current. One end of the element is intended to face the recording medium during operation. For good operation it is important that the edge be as near as possible to, and preferably in contact with, the recording medium. As a result of this, however, the dimension of the element normal to said edge, i.e. its height decreases during use as a result of detrition. In order to maintain good operation of the element as long as possible, one would want to choose the height as large as possible, for example, 100 microns. For a good reproduction of short wavelengths, however, the height may not be chosen to be too large and typically is from 5 to 10 microns..

It is the object of the invention to provide a solution to this dilemma. For that purpose, the magnetic converter according to the invention is characterized in that the current source is designed to supply a high frequency alternating current having a frequency $\omega_t$ which is larger than $8\rho/\mu D$, where $\mu$ is the magnetic permeability in Henry/m of the magnetoresistive material, $\rho$ is the resistivity in ohm.m and D is the cross-section in m².

By operating the strip of magnetoresistive material with such a high frequency current, a current distribution occurs in the strip which is given by the lateral skin effect. This current distribution is characterized by a concentration of the current at the edges of the strip, namely at the edge facing the recording medium and the oppositely located edge. As a result of this it is possible with a comparatively large height of the strip to nevertheless achieve a large sensitivity.

A Gunn oscillator or L.S.A. oscillator is preferably used as a current source in the device according to the invention. Oscillators of this type produce a sufficient power at the frequencies required in the scope of the invention.

The invention will be described in greater detail, by way of example, with reference to the drawing.

Figure 1:
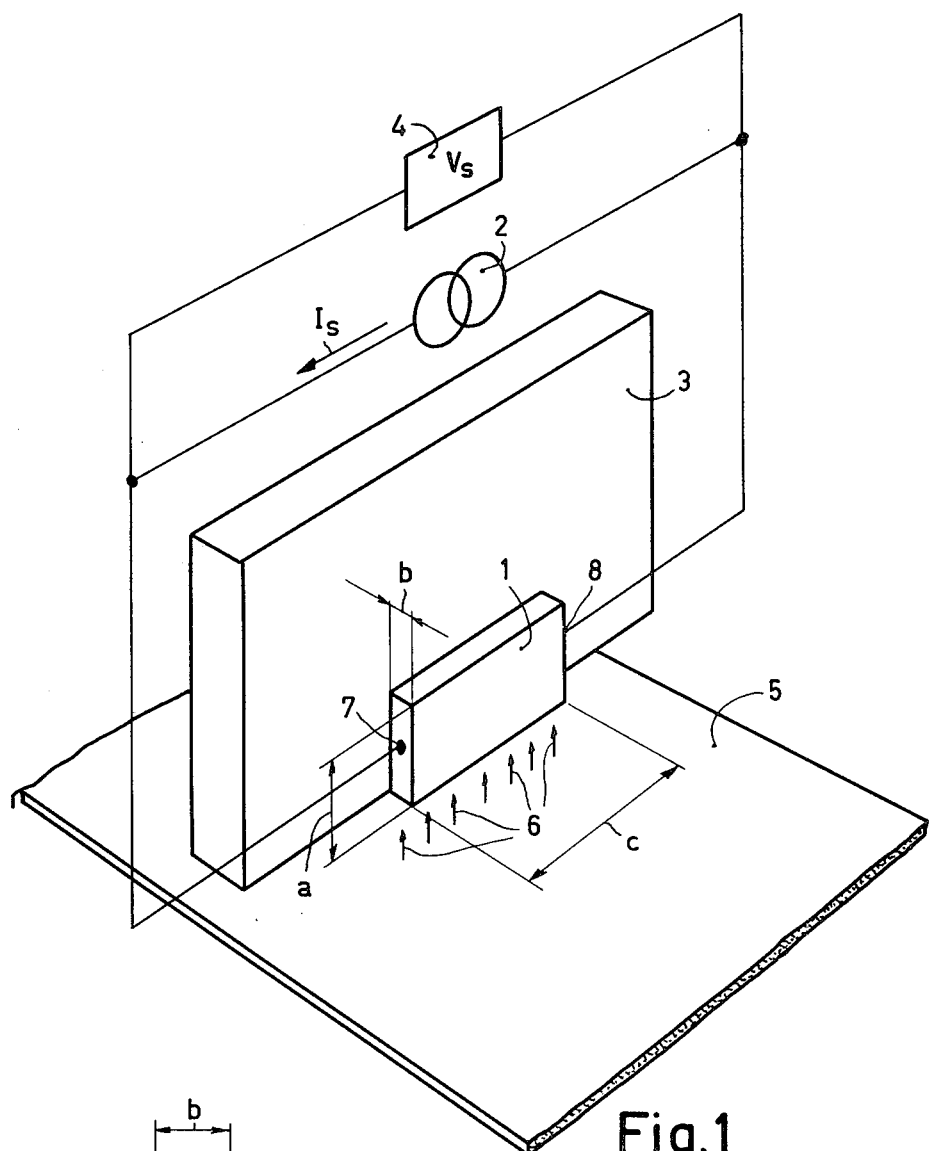
FIG. 1 shows diagrammatically a magnetic converter having a magnetoresistive strip of the type to which the present invention relates.

FIG. 1 shows a magnetic converter having a strip 1 of magnetoresistive material provided on a non-magnetic substrate 3 and connected to said strip is a current source 2. The source 2 is a high-frequency oscillating current source which controls the measuring current $I_s$ through the strip 1. The voltage between the terminals 7 and 8 of the strip 1 is denoted by $V_s$ and is measured by means of the measuring instrument 4. This voltage is a measure of the information representing magnetic fields 6 originating from the magnetic recording medium 5 to which the strip 1 is coupled magnetically. The strip 1 is at right angles to the plane of the recording medium 5. The dimensions of the strip 1 are denoted by the letters a, b and c, where a is the height of the strip, b is the thickness and c is the track width. For the strip 1, thin layers of material are used of which Ni-Fe having a thickness between 200 and 2000 A is the most common.

Figure 2:
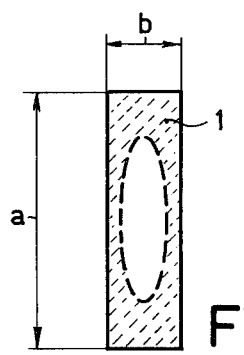
FIG. 2 is a sectional view of the magnetoresistive strip of FIG. 1 showing the current distribution produced with in the construction according to the invention.

When it is ensured that the current source 2 produces a measuring current $I_s$ having a frequency $\omega_t$ which is larger than $8\rho/\mu ab$, and if $a >> b$, which is just desired for the application as a magnetic head, the measuring current will be concentrated, as a result of the occurrence of the lateral skin effect, on the two opposite edges of the strip 1, as is shown, by means of the shaded area in FIG. 2, which is a sectional view of the strip. It is to be noted that the dimension a in magnetoresistive elements is indeed many times larger than the dimension b. For example, a=100 $\mu$m and b=0.1$\mu$m. With a resistivity $\rho = 15.10^{-8}$ ohm.m and a relative magnetic permeability $\kappa_r = 10$ the value of the limit frequency for such a strip (the frequency above which the lateral skin effect occurs) then is 1519.8 MHz. This frequency is just in the range for which a sufficient power is reached with Gunn or L.S.A. oscillators for the present application (10 mW in c.w. operation, with efficiency of 2 to 5%).

As a result of the concentration of the current at the strip edges, the dimension a may be chosen to be so large that a larger resistance to detrition is achieved than is possible in the known converters of the kind mentioned in the preamble. As a is made larger, the demagnetizing field in the interior of the strip becomes smaller, so that the sensitivity to external fields increases and the loss of sensitivity by concentration of the measuring current at the edge of the strip 1 which is furthest away from the recording medium 5, is compensated for.

What is claimed is:

1. A magnetic converter for detecting information-representing magnetic fields on a magnetic recording medium movable relative to the converter, said converter comprising a magnetoresistive strip having one end adapted to face the recording medium and means for detecting resistance variations of said strip, said detecting means including means for applying, to two opposite sides of said strip adjacent said one end, an alternating current of a sufficiently high frequency to produce a current distribution in said strip such that the current is concentrated in a region of said strip adjacent said one end and a region adjacent the end of said strip opposite said one end due to lateral skin effect.

2. A magnetic converter for detecting information-representing magnetic fields on a magnetic recording medium movable relative to the converter, said converter comprising a magnetoresistive strip having one end adapted to face the recording medium and means for detecting resistance variations of said strip, said detecting means including means for applying, to two opposite sides of said strip adjacent said one end, an alternating current of a frequency $\omega_t$ which is larger than $8\rho/\mu D$ where $\mu$ is the magnetic permeability in Henry/n of the magnetoresistive material, $\rho$ is the resistivity in ohm.m and D is the cross-section in $M^2$.

3. A converter according to claim 2, wherein said strip is rectangular and has a width singificantly greater than its thickness.

4. A converter according to claim 2, wherein said applying means includes a Gunn oscillator for supplying said alternating current.

5. A converter according to claim 2, wherein said applying means includes an L.S.A. oscillator for supplying said alternating current.

* * * * *

UNITED STATES PATENT OFFICE
CERTIFICATE OF CORRECTION

Patent No. 4,190,871               Dated February 26, 1980

Inventor(s)   Anthonie Walraven

It is certified that error appears in the above-identified patent and that said Letters Patent are hereby corrected as shown below:

Col. 4, line 6, After "cross-section in" delete

" M " and insert -- m --

Signed and Sealed this

Seventeenth Day of February 1981

[SEAL]

Attest:

Attesting Officer

RENE D. TEGTMEYER

Acting Commissioner of Patents and Trademarks